United States Patent
Mariani et al.

(10) Patent No.: US 9,831,127 B2
(45) Date of Patent: Nov. 28, 2017

(54) METHOD OF PROCESSING A SEMICONDUCTOR SUBSTRATE AND SEMICONDUCTOR CHIP

(71) Applicant: Infineon Technologies AG, Neubiberg (DE)

(72) Inventors: Franco Mariani, Regensburg (DE); Korbinian Kaspar, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/000,100

(22) Filed: Jan. 19, 2016

(65) Prior Publication Data

US 2016/0211179 A1    Jul. 21, 2016

(30) Foreign Application Priority Data

Jan. 21, 2015    (DE) .................. 10 2015 100 827

(51) Int. Cl.
*H01L 21/78* (2006.01)
*H01L 21/304* (2006.01)
(Continued)

(52) U.S. Cl.
CPC ............ *H01L 21/78* (2013.01); *H01L 21/304* (2013.01); *H01L 21/67092* (2013.01);
(Continued)

(58) Field of Classification Search
CPC ................ H01L 22/34; H01L 23/544; H01L 2221/68327; H01L 2221/6834; H01L 2221/68386; H01L 2224/2902
See application file for complete search history.

(56) References Cited

U.S. PATENT DOCUMENTS 8,906,782 B2    12/2014 Engelhardt et al.
2002/0042189 A1    4/2002 Tanaka
(Continued)

FOREIGN PATENT DOCUMENTS

DE    102012110603 A1    5/2013
DE    102013205644 A1    10/2013
EP    2200074 A1    6/2010

OTHER PUBLICATIONS

Loctite Ablestik C130, Technical Data Sheet, Oct. 2014, 2 pages, Henkel Corporation.

*Primary Examiner* — Dale E Page
*Assistant Examiner* — Long H Le
(74) *Attorney, Agent, or Firm* — Viering, Jentschura & Partner mbB

(57) ABSTRACT

A method of processing a semiconductor substrate is provided. The method may include forming a film over a first side of a semiconductor substrate, forming at least one separation region in the semiconductor substrate between a first region and a second region of the semiconductor substrate, arranging the semiconductor substrate on a breaking device, wherein the breaking device comprises a breaking edge, and wherein the semiconductor substrate is arranged with the film facing the breaking device and in at least one alignment position with the at least one separation region aligned with the breaking edge, and forcing the semiconductor substrate to bend the first region with respect to the second region over the breaking edge until the film separates between the breaking edge and the at least one separation region.

20 Claims, 9 Drawing Sheets

(51) Int. Cl.
*H01L 23/00* (2006.01)
*H01L 21/67* (2006.01)
*H01L 21/683* (2006.01)

(52) U.S. Cl.
CPC .... *H01L 21/67132* (2013.01); *H01L 21/6836* (2013.01); *H01L 24/27* (2013.01); *H01L 24/29* (2013.01); *H01L 2221/6834* (2013.01); *H01L 2221/68327* (2013.01); *H01L 2221/68386* (2013.01); *H01L 2224/2902* (2013.01)

(56) References Cited

U.S. PATENT DOCUMENTS

| | | | |
|---|---|---|---|
| 2004/0075172 A1* | 4/2004 | Bauer | H01L 24/10 257/734 |
| 2007/0155055 A1* | 7/2007 | Yang | H01L 21/78 438/113 |
| 2008/0220591 A1* | 9/2008 | Nakamura | H01L 21/6835 438/464 |
| 2009/0121337 A1* | 5/2009 | Abe | B23K 26/0057 257/686 |
| 2009/0124063 A1 | 5/2009 | Nakamura | |
| 2009/0215246 A1 | 8/2009 | Kitahara et al. | |
| 2009/0280622 A1 | 11/2009 | Genda et al. | |
| 2010/0015784 A1 | 1/2010 | Nakamura et al. | |
| 2010/0221893 A1* | 9/2010 | Harris | H01L 21/78 438/462 |
| 2012/0100694 A1 | 4/2012 | Kajiyama et al. | |
| 2012/0187542 A1 | 7/2012 | Kurosawa et al. | |
| 2012/0235282 A1 | 9/2012 | Tomono et al. | |
| 2013/0115755 A1* | 5/2013 | Engelhardt | H01L 21/78 438/460 |
| 2015/0044856 A1 | 2/2015 | Engelhardt et al. | |

* cited by examiner

METHOD OF PROCESSING A SEMICONDUCTOR SUBSTRATE AND SEMICONDUCTOR CHIP

CROSS-REFERENCE TO RELATED APPLICATION

This application claims priority to German Patent Application Serial No. 10 2015 100 827.0, which was filed Jan. 21, 2015, and is incorporated herein by reference in its entirety.

TECHNICAL FIELD

Various embodiments relate generally to a method of processing a semiconductor substrate and to a semiconductor chip.

BACKGROUND

A semiconductor device, e.g. a semiconductor chip (also referred to as die) may include, for example on its back side, a film for attaching the semiconductor device to a carrier, for example to a leadframe. The film may be referred to as die attach film (DAF). The film may be dielectric. Alternatively, it may be electrically conductive, in which case it may be referred to as a conductive die attach film (C-DAF). The film, e.g. the die attach film, may include various materials, e.g. epoxy and/or silver. During a separation process of a wafer using a sawing blade, which may be referred to as sawing or dicing of the wafer, these materials may damage the sawing blade, e.g. a sawing blade including a nickel binder. A sawing quality may thus deteriorate rapidly. This may cause scratches on side walls of the semiconductor device and/or a so-called chipping (small chips of semiconductor material breaking off from the semiconductor device, e.g. from its back side). The scratches and/or the chipping may impair a functionality and/or a breaking resistance of the semiconductor device.

SUMMARY

A method of processing a semiconductor substrate is provided. The method may include forming a film over a first side of a semiconductor substrate, forming at least one separation region in the semiconductor substrate between a first region and a second region of the semiconductor substrate, arranging the semiconductor substrate on a breaking device. The breaking device includes a breaking edge, and the semiconductor substrate is arranged with the film facing the breaking device and in at least one alignment position with the at least one separation region aligned with the breaking edge. The method may further include forcing the semiconductor substrate to bend the first region with respect to the second region over the breaking edge until the film separates between the breaking edge and the at least one separation region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1A:
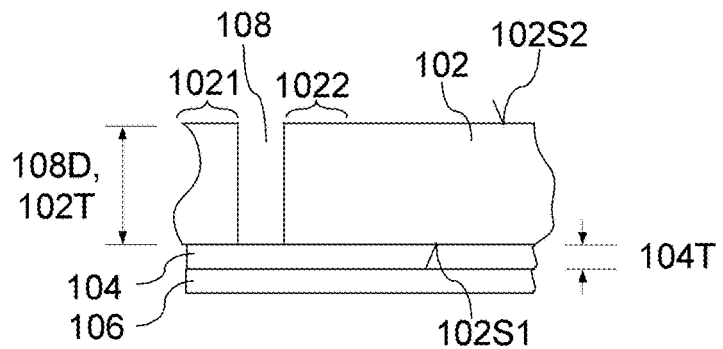
FIG. 1A to 1C show, as cross-sectional views, various stages and/or processes of a method of processing a semiconductor substrate in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The word "dicing" may be used herein to mean a general process of separating a semiconductor substrate (e.g. a wafer) into a plurality of individual portions (e.g. chips). The word "dicing" may be used herein to mean a process of separating a semiconductor substrate (e.g. a wafer) into a plurality of individual portions (e.g. chips) by sawing. It may be derived from the respective context whether a respective process may be limited to sawing, or whether any suitable separating process may be used.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a method of processing a semiconductor substrate may be provided that may include a two-part process for separating the semiconductor substrate and a film formed on the semiconductor substrate, e.g. a film configured for attaching the semiconductor substrate to a carrier, for example to a leadframe (also referred to as die attach film (DAF)). During a first part of the two-part process, the semiconductor substrate may be treated for separating it (e.g. by at least partly removing the semiconductor substrate or by weakening it for separating it later). During a second part of the two-part process, the film may be separated using a breaking device having a breaking edge. The film may be separated, for example by bending it over the breaking edge until it breaks, between the treated region of the semiconductor substrate and the breaking edge.

As a consequence, a damaging, e.g. by scratching and/or chipping, of the semiconductor substrate, and, e.g., of individual semiconductor devices, e.g. semiconductor chips (also referred to as dies), into which the semiconductor substrate may be separated, may be avoided.

In various embodiments, a functionality, breaking strength and/or reliability of the individual semiconductor devices may thus be improved.

Figure 1B:
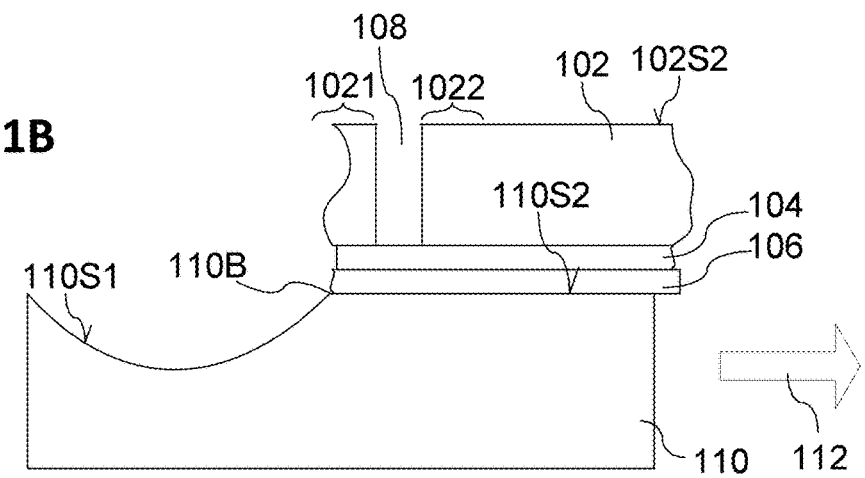
Figure 1C:
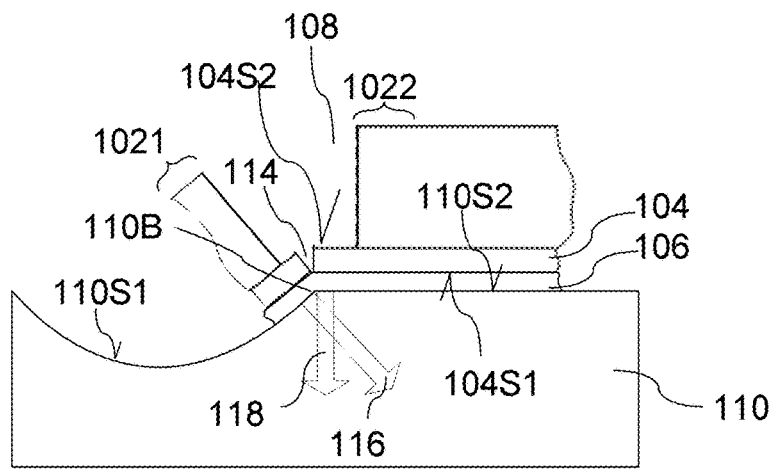

FIG. 1A to 1C show, as cross-sectional views, various stages and/or processes of a method of processing a semiconductor substrate 102 in accordance with various embodiments.

As shown in FIG. 1A, the semiconductor substrate 102 may include a first surface 102S1 and a second surface 102S2 opposite the first surface 102S1. The semiconductor substrate 102 may include at least one active region (not shown), which may include at least one electronic device, extending from the second surface 102S2 into the semiconductor substrate 102. The second surface 102S2 may thus also be referred to as active surface 102. The second surface 102S2 may be arranged on a second side of the semiconductor substrate 102. The first surface 102S1 may also be referred to as back surface 102S1. The first surface 102S1 may may be arranged on a first side of the semiconductor substrate 102.

In various embodiments, the semiconductor substrate 102 may include or essentially consist of any type of semiconductor material, for example a semiconductor material commonly used for forming integrated circuits, e.g. silicon, germanium, a compound semiconductor like gallium arsenide or silicon carbide, or the like.

In various embodiments, the semiconductor substrate 102 may be a wafer, e.g. a sillicon wafer. The at least one active region included in the wafer may be a plurality of active regions. The wafer may be configured to be separated into a plurality of individual chips, each of which may include at least one active region.

In various embodiments, the semiconductor substrate 102 may have a thickness 102T. The thickness 102T of the semiconductor substrate 102 may be in a range from about 50 µm to about 2 mm, for example a typical thickness of a wafer, e.g. around 675 µm, around 725 µm, around 775 µm, etc., or a different thickness, for example obtained by thinning a wafer, e.g. by thinning to a thickness in a range from about 50 µm to about 400 µm.

The method of processing a semiconductor substrate 102 may include forming at least one separation region 108 in the semiconductor substrate 102. The separation region 108 may be formed between a first region 1021 and a second region 1022 of the semiconductor substrate 102. The at least one separation region 108 may be laterally adjacent to the first region 1021 and to the second region 1022. The at least one separation region 108 may extend laterally in the semiconductor substrate 102, e.g. laterally through the semiconductor substrate 102 e.g. from one point of a circumferential surface of the semiconductor substrate 102 to another point of the circumferential surface of the semiconductor substrate 102, for example as an essentially straight region. The at least one separation region 108 may be a region in which the semiconductor substrate 102 may be configured to be separated for separating the semiconductor substrate 102, e.g. the wafer, into individual chips. Any known process suitable for forming the at least one separation region 108 may be used.

The at least one separation region 108 may have a depth 108D. In various embodiments, the at least one separation region 108 may extend from the second surface 102S2 of the semiconductor substrate 102 through the semiconductor substrate 102 to the first surface 102S1 of the semiconductor substrate 102. In other words, the depth 108D of the at least one separation region 108 may be equal to the thickness 102T of the substrate 102. The at least one separation region 108 may extend from the second surface 102S2 only partially through the semiconductor substrate 102, for example by less than 100%, e.g. by between 20% and 99%, e.g. by between 40% and 80%, of the thickness 102T of the semiconductor substrate 102. The at least one separation region 108 may extend from the second surface 102S2 only partially through an initial thickness of the semiconductor substrate 102. Then, the semiconductor substrate 102 may be thinned from the first surface 102S1 of the semiconductor substrate 102, e.g. the first surface 102S1 may be ground, until the (e.g. final) thickness 102T of the semiconductor substrate 102 is reached. This process may also be referred to as dice-before-grind process. After the thinning, e.g. the grinding, the separation region 108 may extend partially or completely, e.g. as described above, from the second surface 102S2 of the semiconductor substrate 102 through the semiconductor substrate 102 to the first surface 102S1 of the semiconductor substrate 102.

In various embodiments, the at least one separation region 108 may be formed by at least one opening, e.g. a trench. In other words, the at least one separation region 108 may be formed by removing a portion of the semiconductor substrate 102 located in the at least one separation region 108. The removing the portion of the semiconductor substrate 102 located in the at least one separation region 108 may for example include or essentially consist of sawing (also referred to as dicing), laser ablation, and/or etching, e.g. plasma etching, or a combination thereof.

Figure 3A:
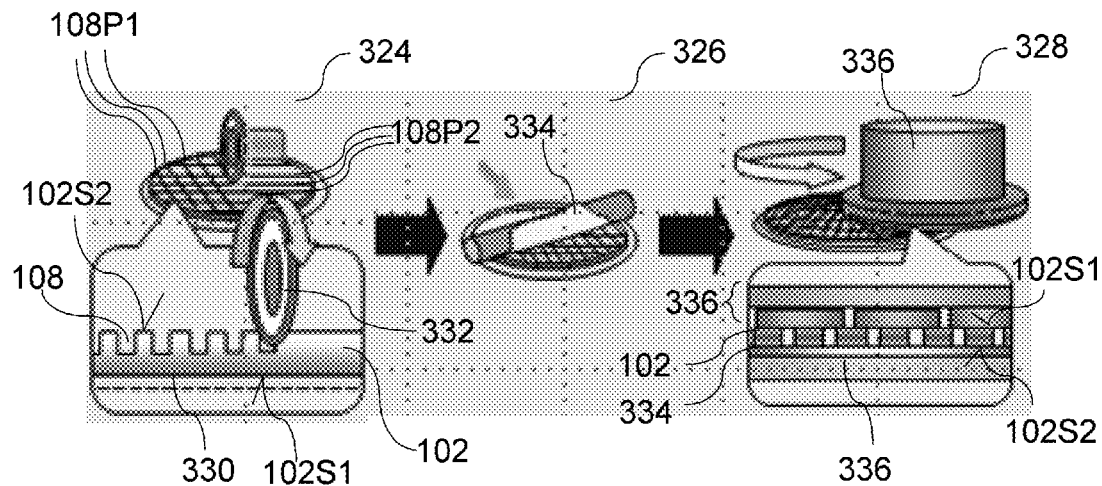
FIG. 3A to 3E show, as perspective schematic views 3A to 3C and cross-sectional schematic views 3D and 3E, various stages and/or processes of a method of processing a semiconductor substrate in accordance with various embodiments.

In various embodiments, a cross section of the at least one separation region 108 may be rectangular, as e.g. shown in FIG. 3A. In other words, a bottom of the at least one separation region 108, e.g. of the opening, e.g. of the trench, may be flat. The cross section of the at least one separation region 108 may have a different shape. For example, the bottom of the at least one separation region 108, e.g. of the opening, e.g. of the trench, may be V-shaped or concave. Thereby, a region for the separating of the semiconductor substrate 102 may be more confined.

In various embodiments, the at least one separation region 108 may be formed from the first side and/or from the second side of the semiconductor substrate 102, as desired. For example in a case of the at least one separation region 108 only extending partially through the semiconductor substrate 102, and/or of the first surface 102S1 of the semiconductor substrate 102 being ground after the forming of the at least one separation region 108, the at least one separation region 108 may be formed from the first side of the semiconductor substrate 102. For example in a case of the at least one separation region 108 extending completely through the semiconductor substrate 102, i.e. from the first surface 102S1 to the second surface 102S2, the at least one separation region 108 may be formed from the first side and/or from the second side of the semiconductor substrate 102.

In various embodiments, before and/or after the forming of the at least one separation region 108, one or more films, layers or the like may be arranged on the semiconductor substrate 102. For example, before sawing or laser ablating the semiconductor substrate 102 from the second surface 102S2, a layer configured for sawing or laser ablating the semiconductor substrate 102, respectively, may be attached to the first surface 102S1 of the semiconductor substrate 102. By way of example, before plasma etching the semiconductor substrate 102, a structured mask, e.g. a mask layer, e.g. a structured photoresist, may be formed on the semiconductor substrate 102. In various embodiments, a carrier film for stabilizing the semiconductor substrate 102 and/or for keeping portions of the semiconductor substrate 102 in place, may be arranged, e.g. temporarily arranged, on the semiconductor substrate 102. A film may serve two or more purposes, for example a grinding film attached to the second surface 102S2 of the semiconductor substrate 102 for grinding the first surface 102S1 may also serve as a carrier film.

As shown in FIG. 1A, the method of processing the semiconductor substrate 102 may include forming a film 104 over the first side 102S1 of the semiconductor substrate 102. The film 104 may for example be laminated over, e.g. on, the semiconductor substrate 102. The film 104 may be configured to remain on the semiconductor substrate 102. On each portion of a plurality of portions of the semiconductor substrate 102 into which the semiconductor substrate 102 may be separated at the at least one separation region 108, a portion of the film 104 may remain. For example, in case of the semiconductor substrate 102 including or essentially consisting of a wafer, the film 104 may form a part of each semiconductor chip to be formed from the wafer.

In various embodiments, the film 104 may be configured to be used for connecting, e.g. electrically and/or thermally, the semiconductor substrate 102, e.g. each portion of the plurality of portions of the semiconductor substrate 102, to a carrier, e.g. to a leadframe. In various embodiments, the film 104 may be a so-called die attach film (DAF). In a case of the die attach film being electrically conductive, the die attach film may be referred to as a conductive die attach film (C-DAF).

In various embodiments, the film 104 may include or essentially consist of any material or combination of materials, also referred to as the film material, that may be formed as a layer on the semiconductor substrate 102, and which may have or obtain properties that may make it suitable for process for separating the film 104 as described below, e.g. for breaking the film 104. By way of example, the film 104 with a thickness 104T may be or be configured to be made rigid enough for being broken.

In various embodiments, an elastic modulus (which may also be referred to as tensile modulus) of the film material may be higher than about 5 kN/mm$^2$, e.g. higher than about 8 kN/mm$^2$, e.g. about 8.6 kN/mm$^2$, at least during the separation process. The elastic modulus of the film material may be sufficiently high, e.g. in the range given above, for breaking the film 104 at a regular processing temperature for the processing, e.g. the separating, of the semiconductor substrate 102, for example room temperature. Alternatively, the elastic modulus of the film material may be sufficiently high, e.g. in the range given above, for breaking the film 104 at a lower temperature, e.g. a temperature below room temperature, e.g. at a temperature below about 20° C., e.g. below about 10° C., e.g. below 0° C. The film 104 may for example include or essentially consist of the electrically conductive die attach material Loctite Ablestik C130 (which may have an elastic modulus of about 8.666 kN/mm$^2$ at 25° C.).

The thickness of the film 104 may be in a range from about 5 μm to about 100 μm, e.g. from about 20 μm to about 50 μm, e.g. about 30 μm.

The film 104 may for example essentially consist of the electrically conductive die attach material Loctite Ablestik C130 and may have a thickness of about 30 μm.

In various embodiments, the film 104 may be formed over the first surface 102S1 of the semiconductor substrate 102 before the forming the at least one separation region 108, for example in a case of the process of forming the at least one separation region 108 may not be harmful for the film 104 and may be carried out from the second side of the semiconductor substrate 102.

The film 104 may be formed over the first surface 102S1 of the semiconductor substrate 102 after the forming of the at least one separation region 108, for example in a case of the process of forming the at least one separation region 108 being harmful for the film 104, or of the process of forming the at least one separation region 108 having to be carried out from the first side of the semiconductor substrate 102.

A layer 106 may be formed over the film 104. The layer 106 may for example be fixed on the film 104. The layer 106 may for example be laminated on the film 104. The layer 106 may be configured to withstand the process for separating the film 104 without hindering or preventing the process. The layer 106 may for example be more flexible than the film 104. It may for example be elastic.

The layer 106 may serve to keep the separated portions of the semiconductor substrate 102 (with the film 104 formed thereon) in an orderly arrangement, e.g. fixed to the layer 106. The separated portions of the semiconductor substrate 102 may for example essentially keep their original positions and orientations, e.g. in a case of the layer 106 being flexible, but not elastic, or of the layer 106 being elastic, but without using the elasticity for expanding the layer 106. In a case of the layer 106 being elastic, the layer 106 may be expanded for increasing a distance between the separated portions, for example for preventing damage during handling and/or shipping, or for an easier handling of the separated portions, e.g. the chips. The layer 106 may for example be an expansion tape as commonly used in the art, or it may include or essentially consist of any other suitable flexible material, e.g. a polymer, e.g. as such a conventional carrier tape. The film 104 (and the semiconductor substrate 102 on which it is formed) may be releasably fixed to the layer 106. After the separating, the individual portions may for example be picked up from the layer 106 for further processing. The layer 106 (to which the semiconductor substrate 102 with the film 104 may be attached, e.g. fixed) may be mounted in a frame, e.g. in a so-called dicing frame (not shown). For example, an edge of the layer 106 may be mounted to the frame.

In various embodiments, as shown in FIG. 1B, the method may include arranging the semiconductor substrate 102 on a breaking device 110.

Figure 4A:
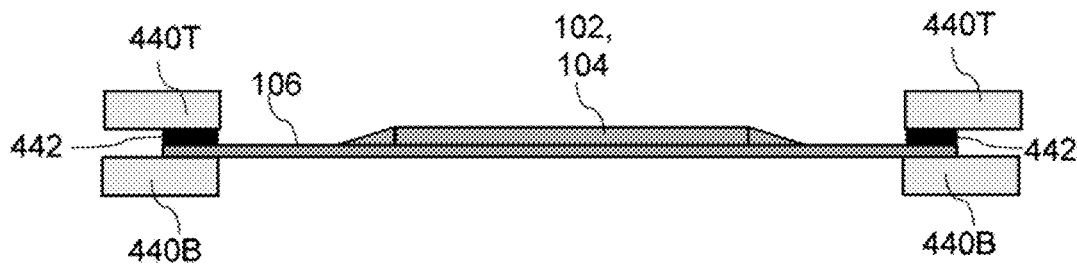
FIG. 4A to 4E visualize different aspects of a method of processing a semiconductor substrate in accordance with various embodiments.
Figure 4B:
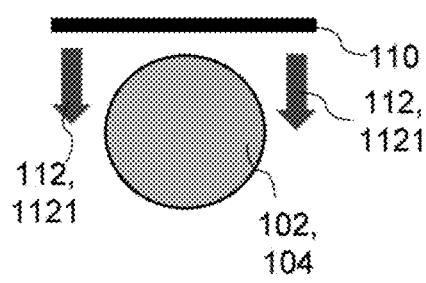
Figure 4C:
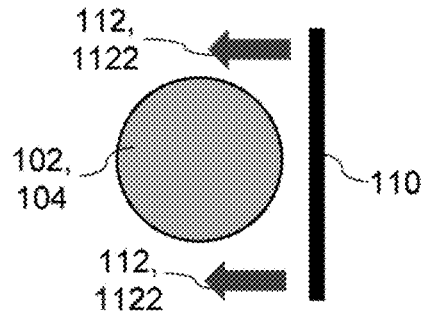

The breaking device 110 may include a breaking edge 110B. The breaking edge 110B may form a straight edge 110B. The breaking edge 110B may be formed between a first surface 110S1 and a second surface 110S2 of the breaking device 110. The second surface 110S2 may be essentially planar. The first surface 110S1 may be recessed from the plane of the second surface 110S2. The first surface 110S1 and the second surface 110S2 may be connected to form the breaking edge 110B as a common edge. The first surface 110S1 and the second surface 110S2 may enclose an angle α. The angle α may be larger than 90° and smaller than 180°, for example between about 110° and 160°. For example, a conventional breaking device used for separating a wafer that was laser treated for laser stealth dicing (e.g. as shown in FIG. 4E) may be used.

The term "laser stealth dicing" may refer to a technique of treating a semiconductor substrate, e.g. a wafer, with a laser, wherein a portion of the semiconductor substrate may not be ablated, but rather weakened (e.g. by changing a crystalline structure), and to then separate the semiconductor substrate, e.g. the wafer, at the weakened portion of the semiconductor substrate, e.g. by expanding or bending the semiconductor substrate.

The semiconductor substrate 102 may be arranged with the film 104 facing the breaking device 110 as shown in FIG. 2. The semiconductor substrate 102 may be arranged at least partially over the second surface 110S2 of the breaking device 110. The semiconductor substrate 102 may be arranged with the layer 106 contacting the second surface 110S2 of the breaking device 110.

In various embodiments, the semiconductor substrate 102 may be arranged in at least one alignment position with the at least one separation region 108 aligned with the breaking edge 110B. In other words, the method may include arranging the semiconductor substrate in at least one alignment position with the at least one separation region 108 aligned with the breaking edge 110B. The at least one separation region 108 being aligned with the breaking edge 110B may be understood as the (e.g. straight) breaking edge 110B and the (e.g. straight) separation region 108 being parallel to each other, and the breaking edge 110B being arranged at least partially inside a vertical projection of the separation region 108. A length of the breaking edge 110B (which may extend into and out of the plane of the paper in FIG. 1B) may be larger than a length of the separation region 108 (which may also extend into and out of the plane of the paper in FIG. 1B), thus the breaking edge 110B may protrude from ends of the vertical projection of the separation region 108.

In FIG. 1B, the semiconductor substrate 102 and the breaking device 110 may not be in the at least one alignment position. The at least one alignment position may be reached by moving the semiconductor substrate 102, the breaking device 110, or both, relative to each other, e.g. in a lateral movement, until the at least one alignment position (as e.g. shown in FIG. 1C) may be reached. For example, the breaking device 110 may be moved relative to the semiconductor substrate 102 in a direction as indicated by an arrow 112. Thereby, the breaking edge 110B, which may be shown in FIG. 1B as being arranged parallel to the at least one separation region 108, but laterally, e.g. horizontally, displaced from the vertical projection of the at least one separation region 108, may be shifted horizontally to the at least one alignment position with the breaking edge 110B being arranged at least partially inside the vertical projection of the separation region 108.

In various embodiments, in the at least one alignment position, the first region 1021 of the semiconductor substrate 102 may be arranged over the first surface 110S1 of the breaking device 110, and the second region 1022 of the semiconductor substrate 102 may be arranged over the second surface 110S2 of the breaking device 110.

As shown in FIG. 1C, the method may include forcing the semiconductor substrate 102 to bend the first region 1021 with respect to the second region 1022 over the breaking edge 110B until the film 104 separates between the breaking edge 110B and the at least one separation region 108.

When the semiconductor substrate 102 and the breaking device 110 may be in the at least one alignment position, force may be exerted, e.g. in the directions indicated by arrows 116, 118 in FIG. 1C, for forcing (e.g. pulling, e.g. sucking, or pushing) the first region 1021 of the semiconductor substrate 102 towards the first surface 110S1 of the breaking device 110, and for forcing (e.g. pulling, e.g. sucking, or pushing) the second region 1022 of the semiconductor substrate 102 towards the second surface 110S2 of the breaking device 110. Thereby, the semiconductor substrate 102 may be forced to bend over the breaking edge 110B. One or more of various parameters, e.g. properties of the separation region 108 (e.g. a depth 108D and/or a shape), an amount of force, a geometry of the breaking device 110, e.g. of the breaking edge 110B, a material of the film 104, a thickness 104T of the film 104, and optionally a temperature of the film 104 may in various embodiments be adjusted such that the film 104 breaks. These various parameters may be adjusted such that the film 104 may break between the at least one separation region 108 and the breaking edge 110B, but may not break in regions of the semiconductor substrate 102 and/or the film located, e.g. laterally, adjacent to the at least one separation region 108, e.g. in the first region 1021 or in the second region 1022.

As described above, the film 104 may be rigid at least during the forcing the semiconductor substrate 102 to bend the first region 1021 with respect to the second region 1022 over the breaking edge 110B until the film 104 separates between the breaking edge 110B and the at least one separation region 108.

In other words, the film 104 may be rigid, e.g. brittle enough to break in a region between the breaking edge 110B and the separation region 108 when the force is exerted as described above.

In various embodiments, the film 104 may separate between a first surface 104S1 and a second surface 104S2 of the film. In other words, the film 104 may completely separate between the breaking edge 110B and the at least one separation region 108 when forced to bend over the breaking edge 110B.

In various embodiments, a moving apart of the first portion 1021 and the second portion 1022 of the semiconductor substrate 102 may be prevented by the layer 106 to which the semiconductor substrate 102 may be fixed.

The forcing the semiconductor substrate 102 to bend the first region 1021 with respect to the second region 1022 may include applying the force 116, 118, e.g. a vacuum suction force, to the semiconductor substrate 102. The vacuum suction force may be provided at the breaking edge 110B to suck the first region 1021 of the semiconductor substrate 102 towards the first surface 110S1 of the breaking device 110, and the second region 1022 of the semiconductor substrate 102 towards the second surface 110S2 of the breaking device 110. Channels 436, 438 (not shown here, but on FIG. 3D) may be formed in the breaking device 110 configured to provide the vacuum suction force.

FIGS. 2A to 2D show, as cross-sectional views, various stages and/or processes of a method of processing a semiconductor substrate 102 in accordance with various embodiments.

The processes, materials, properties, parameters etc. shown in FIG. 2A to FIG. 2D may generally be similar or identical to those described above, and their description may be omitted.

The method shown in FIG. 2A to 2D may, in various embodiments, differ from the embodiments shown in FIG. 1A to FIG. 1C by at least one separation region 108 being formed within a semiconductor substrate 102, i.e. by partially modifying, rather than partially removing, the semiconductor substrate 102. In the at least one separation region 108, the semiconductor material of the semiconductur substrate 102 may be treated, e.g. by a laser, in such a way that a structural strength, in other words a resilience, e.g. a breaking strength and/or a tensile strength, may be diminished. In other words, the semiconductor substrate 102 may be weakened in the at least one separation region 108. In other words, the forming the at least one separation region 108 in the semiconductor substrate 102 may include weakening the semiconductor substrate 102 in the at least one separation region 108.

A laser may be used for the weakening the semiconductor substrate 102 in the at least one separation region 108. The laser may be used for modifying the semiconductor substrate 102 in the at least one separation region 108. The laser may be used for a so-called laser stealth dicing process in the at least one separation region.

In various embodiments, the weakened at least one separation region 108 may extend from a first surface 102S1 to a second surface 102S2 of the semiconductor substrate 102.

In various embodiments, during a forcing the semiconductor substrate 102 to bend a first region 102I of the semiconductor substrate 102 with respect to a second region 102II of the semiconductor substrate 102 over a breaking edge 110B until the film 104 separates between the breaking edge 110B and the at least one separation region 108, the semiconductor substrate 102 may separate at the at least one separation region 108. In other words, in the exemplary case of the semiconductor substrate 102 not (or only partially) being separated before the forcing the semiconductor substrate 102 to bend the first region 102I with respect to the second region 102II over the breaking edge 110B until the film 104 separates between the breaking edge 110B and the at least one separation region 108, the separating of the semiconductor substrate 102 at the at least one separation region 108 (e.g. in the at least one separation region and/or between the at least one separation region 108 and the first surface 102S1) may occur during the same process as the separating of the film 104 between the breaking edge 110B and the at least one separation region 108.

Figure 2A:
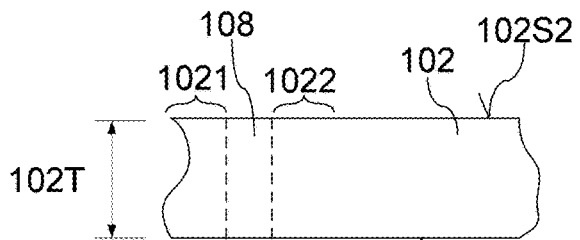
FIGS. 2A to 2D show, as cross-sectional views, various stages and/or processes of a method of processing a semiconductor substrate in accordance with various embodiments.
Figure 2B:
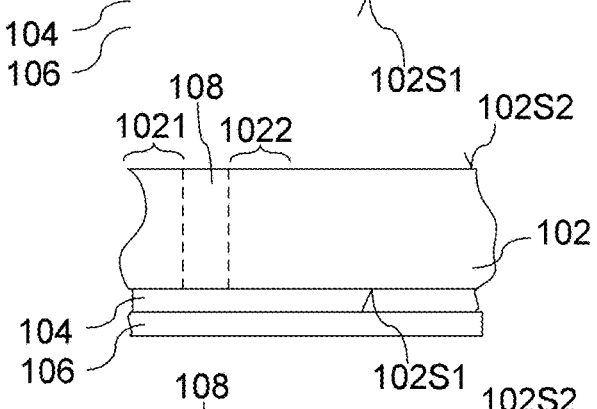
Figure 2C:
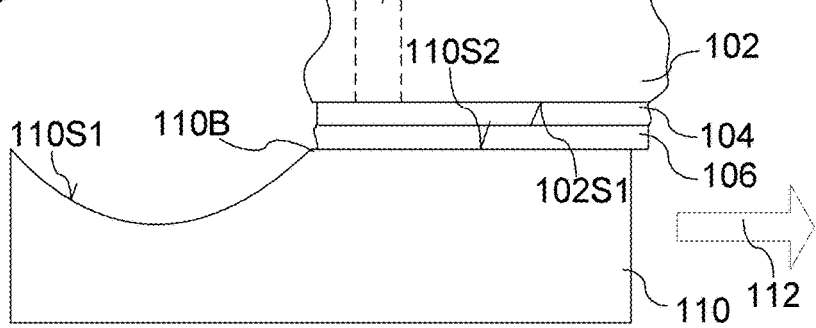
Figure 2D:
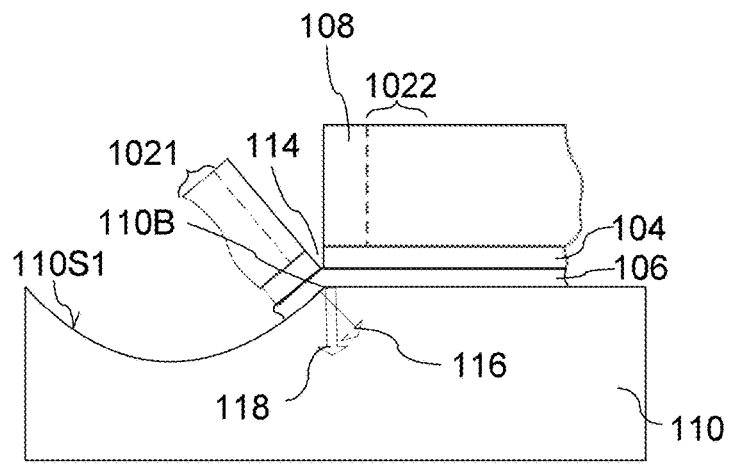

In the embodiments shown in FIG. 2A and FIG. 2B, the film 104 (and a layer 106) may be formed over the semiconductor substrate 102 after the forming of the at least one separation region 108 in the semiconductor substrate 102.

The film 104 (and optionally the layer 106) may be formed over the semiconductor substrate 102 before forming the at least one separation region 108, for example by modifying the semiconductor substrate 102 in the separation region 108.

Figure 3B:
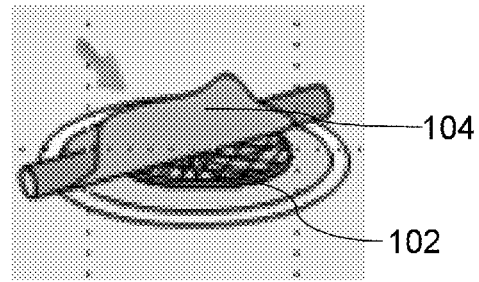
Figure 3C:
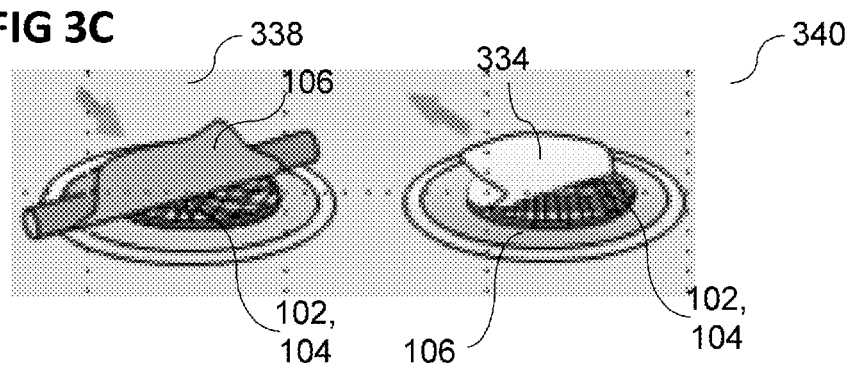
Figure 3D:
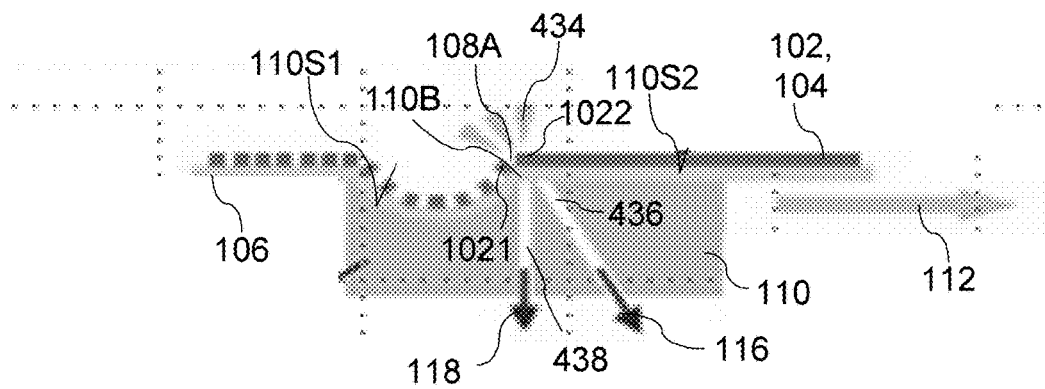
Figure 3E:
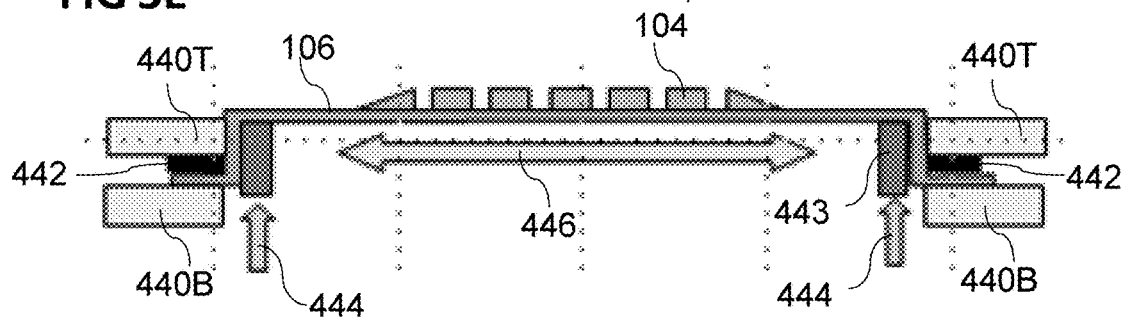

FIG. 3A to FIG. 3E show, as perspective schematic views FIG. 3A to FIG. 3C and cross-sectional schematic views FIG. 3D and FIG. 3E, various stages and/or processes of a method of processing a semiconductor substrate 102 in accordance with various embodiments.

The processes, materials, properties, parameters etc. shown in FIG. 3A to FIG. 3E may generally be similar or identical to those described above, and their description may be omitted.

In various embodiments, as shown in panel 324 of FIG. 3A, forming at least one separation region 108 in the semiconductor substrate 102 between a first region 102I and a second region 102II of the semiconductor substrate 102 may include forming a plurality of separation regions 108 in the semiconductor substrate 102.

The semiconductor substrate 102 may, in various embodiments, be or include a wafer.

In various embodiments, the plurality of separation regions 108 may be formed by sawing, e.g. using a sawing blade. Alternatively, the plurality of separation regions 108 may be formed by etching or irradiating with a laser, e.g. as described above.

As shown in panel 324 of FIG. 3A, the plurality of separation regions 108 may be formed from a second surface 102S2 of the semiconductor substrate 102.

As shown in panel 324 of FIG. 3A, the plurality of separation regions 108 may for example have a depth 108D that may be smaller than an initial thickness of the semiconductor substrate 102. Then, as shown in panels 326 and 328 of FIG. 3A, a temporary layer 334 may be attached to, e.g. fixed on, the second surface 102S2 of the semiconductor substrate 102. The temporary layer 334 may for example be configured for grinding the semiconductor substrate 102 from a first surface 102S1 opposite the second surface 102S2. The temporary layer 334 may for example be a so-called grinding layer, e.g. a grinding layer as known in the art. The first surface 102S1 may be ground, e.g. using a grinding tool 336. The semiconductor substrate 102 may be ground until a thickness 102T is reached. The thickness 102T may be as large as the depth 108D of the plurality of separation regions 108, e.g. as shown in panel 328 of FIG. 3A. In that case, the semiconductor substrate 102 may be separated into individual portions after the grinding. Alternatively, the thickness 102T may be different from the depth 108D, e.g. smaller (in that case, the grinding of the semiconductor substrate 102 may continue after a separation of the semiconductor substrate 102 at the plurality of separation regions 108 is reached) or larger (in that case, a portion of the semiconductor substrate 102 may remain between the plurality of separation regions 108 and the first surface 102S1 of the semiconductor substrate 102.

Alternatively, the plurality of separation regions 108 may for example have a depth 108D that may be smaller than the thickness 102T of the semiconductor substrate 102. In other words, the plurality of separation regions 108 may extend only partially through the semiconductor substrate 102, or the plurality of separation regions 108 may extend completely through the semiconductor substrate 102, in other words, the depth 108D of the plurality of separation regions 108 may be equal to the thickness 102T of the semiconductor substrate 102.

Superficial and/or sub-surface damages that may have been caused by the sawing and/or by the grinding may be reduced or removed, e.g. using a so-called stress release process. The reducing or removing of the damages may include a dry polish using a polygrind grinding wheel, and/or a dry etch process, wherein, using the dry etch process, not only damages on a polished surface, e.g. on the first surface 102S1 (the back surface) of the semiconductor substrate 102 may be reduced or removed, but also damages to side walls, e.g. side walls of the separation regions 108, which may have been caused by the mechanical sawing process.

The plurality of separation regions 108 may include a first plurality 108P1 of essentially parallel separation regions 108. The plurality of separation regions 108 may include a second plurality 108P2 of essentially parallel separation regions 108, and the second plurality 108P2 of essentially parallel separation regions 108 may be essentially orthogonal to the first plurality 108P1 of essentially parallel separation regions 108. In other words, in various embodiments, the forming at least one separation region 108 in the semiconductor substrate 102 may include forming a first plurality 108P1 of essentially parallel separation regions 108 and a second plurality 108P2 of essentially parallel separation regions 108, wherein the second plurality 108P2 of essentially parallel separation regions 108 may be essentially orthogonal to the first plurality 108P1 of essentially parallel separation regions 108.

A distance between the essentially parallel separation regions 108 may correspond to a lateral size of a semiconductor chip. It may for example be in a range from about 100 μm to about 2 cm, e.g. from about 1 mm to about 5 mm. The first plurality 108P1 and the second plurality 108P2 of essentially parallel separation regions 108 may separate the semiconductor substrate 102, e.g. the wafer, into a plurality of semiconductor chips.

As shown in FIG. 3B, a film 104, e.g. a die attach film, e.g. an electrically conductive die attach film, may be attached to the semiconductor substrate 102, e.g. to the first surface 102S1 of the semiconductor substrate 102. The film 104 may for example be laminated over, e.g. on, the semiconductor substrate 102.

A plurality of active regions (not shown) may extend from the first surface 102S1 into the semiconductor substrate 102. Thus, the second surface 102S2 of the semiconductor substrate 102 may be ground, and/or the film 104, which may remain, e.g. permanently, on the semiconductor substrate 102, may be formed over the second surface 102S2 of the semiconductor substrate 102.

In various embodiments, the film 104 may be a preformed film that may be arranged on, e.g. fixed to, the second surface 102S2 of the semiconductor substrate 102. An adhesive, e.g. a glue, may be used for attaching the film 104 to the semiconductor substrate 102. Alternatively, other known methods, e.g. depositing the film 104 on the second surface 102S2 of the semiconductor substrate 102, may be used for arranging the film 104 over the semiconductor substrate 102.

In various embodiments, as shown in panel 338 of FIG. 3C, a layer 106 may be arranged over the second surface 102S2 of the semiconductor substrate 102, for example over the film 104 that may be arranged over the semiconductor substrate 102.

The layer 106 may be a pre-formed layer, e.g. an expansion tape, that may be arranged on, e.g. fixed to, the film 104. An adhesive, e.g. a glue, may be used for attaching the layer 106 to the film 104. Alternatively, other suitable methods may be used for arranging the layer 106 over the film 104.

In panel 340 of FIG. 3C, the semiconductor substrate 102 may be turned around with respect to the orientation shown in panel 338 of FIG. 3C. Thus, in panel 340, the layer 106 may be arranged below the semiconductor substrate 102. The temporary layer 334 may be presented on a top of the semiconductor substrate 102. The method may include removing, e.g. peeling off, the temporary layer 334 from the semiconductor substrate 102. Alternatively, other suitable methods may be used for removing the temporary layer from the semiconductor substrate 102.

As shown in FIG. 3D, the method may include arranging the semiconductor substrate 102 on a breaking device 110. The arranging the semiconductor substrate 102 on the breaking device 110 may include arranging the semiconductor substrate 102 on the breaking device 110 with the film 104 facing the breaking device 110, e.g. with the layer 106 contacting the breaking device 110. In FIG. 3D, the semiconductor substrate 102 and the film 104 formed on it may be shown as an integral element, which may be referred to as the semiconductor substrate 102, 104, with specific reference to the film when required.

The breaking device 110 may include a breaking edge 110B. The breaking device 110 may further include a first surface 110S1 and a second surface 110S2. The breaking edge 110B may be arranged between the first surface 110S1 and the second surface 110S2 of the breaking device 110. The breaking edge 110B may for example be the common edge of the first surface 110S1 and the second surface 110S2. As shown in FIG. 3D, the second surface 110S2 of the breaking device 110 may be essentially flat. In other words, the second surface 110S2 may be arranged in a plane. The first surface 110S1 may be recessed from the plane of the second surface 110S2. For example, as shown in FIG. 3D, the first surface 110S1 may be sloping away from the second surface 110S2, e.g. from the breaking edge 110B.

The method may include arranging the semiconductor substrate 102 over the breaking device 110 in at least one alignment position with the at least one separation region 108 aligned with the breaking edge 110B, e.g. as described above. The at least one alignment position may include a plurality of alignment positions. A number of alignment positions may for example equal a number of separation regions 108.

In FIG. 3D, each separation region 108 of the (e.g. first) plurality of separation regions 108 may extend into and out of the plane of the paper. The breaking edge 110B may also extend into and out of the plane of the paper. One separation region 108A (which may be pointed at by triangular arrows 434) of the (e.g. first) plurality of separation regions 108 may be shown in one alignment position of the plurality of alignment positions. The separation regions 108 of the (e.g. first) plurality of separation regions 108 shown above the first surface 110S1 of the breaking device 110 may have already been in an alignment position of the plurality of alignment positions, whereas the separation regions 108 of the (e.g. first) plurality of separation regions 108 shown above the second surface 110S2 of the breaking device 110 may not yet have been in an alignment position of the plurality of alignment positions. Each separation region 108 of the (e.g. first) plurality of separation regions 108 may subsequently be arranged in one alignment position of the plurality of alignment positions, for example by moving the breaking device 110 and the semiconductor substrate 102 (with the film 104) relative to each other, e.g. by moving the breaking device in a direction indicated by the arrow 112 while the semiconductor substrate 102 may remain in its position. Alternatively, the semiconductor substrate 102 may be moved, or both, the semiconductor substrate 102 and the breaking device 110 may be moved. The direction indicated by the arrow 112 may essentially be orthogonal to the direction in which each of the separation regions 108 of the (e.g. first) plurality of separation regions 108 extends, and essentially parallel to the semiconductor substrate 102, e.g. to the first surface 102S1 and/or to the second surface 102S2 of the semiconductor substrate 102. By moving the the breaking device 110 (and with it the breaking edge 110D) in the direction of the arrow 112, each alignment position of the (e.g. first) plurality of alignment positions may be reached sequentially. In various embodiments, the moving the breaking device 110 relative to the semiconductor substrate 102 in at least one lateral direction 112 may sequentially align each separation region 108 of the plurality of separation regions 108 with the breaking edge 110B.

In various embodiments of the plurality of separation regions 108 including the first plurality 108P1 of separation regions 108 and the second plurality 108P2 of separation regions 108, the semiconductor substrate 102 may first be sequentially arranged in each of the alignment positions corresponding to the first plurality 108P1 of separation regions 108. In that case, the direction of the arrow 112 may correspond to a first direction 1121, for example as indicated in FIG. 4B, which shows an example of the breaking device 110 being moved in the direction 1121 across the semiconductor substrate 102 with the film 104 arranged on it.

In various embodiments, thereafter, the semiconductor substrate 104 and the breaking device 110 may be rotated relative to each other. For example, the breaking device 110 may be rotated, the semiconductor substrate 102 may be rotated, or both may be rotated. Each rotation may be carried out essentially within the plane of the semiconductor substrate 102 and/or of the breaking device 102, respectively. An angle of rotation may correspond to an angle between a direction in which the first plurality 108P1 of separation regions 108 may extend and a direction in which the second plurality 108P2 of separation regions 108 may extend. The semiconductor substrate 102 and the breaking device 110 may be rotated relative to each other to a position in which the breaking edge 110D may be essentially parallel to the second plurality 108P2 of separation regions 108.

Thereafter, in various embodiments, the breaking device 110 (including the breaking edge 110D) may be moved relative to the semiconductor substrate 102 in the direction of the arrow 112 that may correspond to a second direction 1122. The semiconductor substrate 102 may then be sequentially arranged in each of the alignment positions corresponding to the second plurality 108P2 of separation regions 108.

In other words, the moving the semiconductor substrate 102 and the breaking device 110 relative to each other may include moving the breaking device 110 relative to the semiconductor substrate 102 in at least one lateral direction (also referred to as channel 1). The moving the breaking device 110 relative to the semiconductor substrate 102 in at least one lateral direction 112 may include moving the breaking device 110 relative to the semiconductor substrate 102 in a first lateral direction 1121, and then moving the breaking device 110 relative to the semiconductor substrate 102 in a second lateral direction 1122 (also referred to as channel 2).

In various embodiments, an angle between the direction in which the first plurality 108P1 of separation regions 108 may extend and the direction in which the second plurality 108P2 of separation regions 108 may extend may be about 90°, as for example shown in FIG. 3A to FIG. 3B. The first lateral direction 1121 may thus be essentially orthogonal to the second lateral direction 1122. Alternatively, the angle may be different, for example about 45°.

The moving of the breaking device 110 relative to the semiconductor substrate 102 may be referred to as scanning, and moving direction may be referred to as scan direction.

The method may include, when the semiconductor substrate 102 is in one alignment position of the plurality of alignment positions, forcing the semiconductor substrate 102 to bend a first region 1021 of the semiconductor substrate 102 with respect to a second region 1022 of the semiconductor substrate 102, wherein each separation region 108 of the plurality of separation regions 108 may have an adjacent first region 1021 and an adjacent second region 1022, over the breaking edge 110B until the film 104 separates between the breaking edge 110B and the at least one separation region 108.

In various embodiments shown in FIG. 3D, the plurality of separation regions 108 that may be present in a portion of the semiconductor substrate 102 arranged above the second surface 110S2 of the breaking device 110 may not be shown in order to better demonstrate schematically the separating of the film 104 over the breaking edge 110B, which may be indicated by spaces between individual separated portions of the semiconductor substrate 102 (which may have the film 104 attached to it). Nevertheless, in the (e.g. first) plurality of separation regions 108, the semiconductor material of the semiconductor substrate 102 may be removed, e.g. as described above. Alternatively, the (e.g. first) plurality of separation regions 108 may include modified, but not removed, semiconductor material as described above. A distance between the individual portions of the semiconductor substrate 102 (with the film 104 arranged on it) may remain essentially the same before the breaking edge and after the breaking edge. Alternatively, the distance may for example increase.

In various embodiments, during the forcing the semiconductor substrate 102 to bend the first region 1021 with respect to the second region 1022 over the breaking edge 110B, for each alignment position of the plurality of alignment positions, until the film 104 separates between the breaking edge 110B and the respective aligned separation region 108 of the plurality of separation regions 108, the semiconductor substrate 102 may separate at the at least one separation region 108, e.g. in the respective aligned separation region 108 and/or between the respective aligned separation region 108 and the first surface 102S1, for example as described above.

In various embodiments, the layer 106 may remain intact after the breaking of the film 104 between each separation region of the plurality of separation region 108 and the breaking edge 110B. The plurality of individual portions of the semiconductor substrate 102 obtained by the separating of the semiconductor substrate 102 may remain attached to the layer 106. The layer 106 may, in various embodiments, keep the plurality of individual portions of the semiconductor substrate 102 in their original relative positions and orientations. The layer 106 may for example prevent the plurality of individual portions of the semiconductor substrate 102 from tumbling and disarranging after being separated from each other.

The layer 106 may be expanded (e.g. as described above and below) during the process of separating the semiconductor substrate 102. While an expansion force applied to the layer 106 may cause an increased distance between the individual portions of the semiconductor substrate 102 above the first surface 110S1 of the breaking device, the expansion force may not be sufficiently strong for separating the film 104 between the separation regions 108 and the second surface 110S2 of the breaking device 110.

As shown in FIG. 3D, a plurality of channels 436, 438 may be formed in the breaking device 110. Through the plurality of channels 436, 438, a vacuum suction force (e.g. in directions 116, 118) may be provided to the breaking edge 110B, the first surface 110S1 and/or the second surface 110S2 of the breaking device 110. As described above, the vacuum suction force may be provided at the breaking edge 110B to suck the first region 1021 of the semiconductor substrate 102 towards the first surface 110S1 of the breaking device 110, and the second region 1022 of the semiconductor substrate 102 towards the second surface 110S2 of the breaking device 110 for each of the plurality of separation regions 108 with their corresponding respective first region 1021 and second region 1022.

In various embodiments, the vacuum suction force 116, 118 may be provided essentially constantly while the semiconductor substrate 102 and the breaking device 110 may be moved relative to each other. Alternatively, the vacuum suction force 116, 118 may be weaker or absent when the semiconductor substrate 102 is not in one of the plurality of alignment positions. As the breaking device 110, e.g. the breaking device providing the vacuum suction force 116, 118, a breaking device as used in the art for breaking wafers in laser stealth dicing, e.g. as shown in FIG. 4E, may be used.

In various embodiments, the force for bending the semiconductor substrate 102 over the breaking edge 110B until it breaks may be provided differently, e.g. a mechanical force may be used.

In various embodiments, as shown in FIG. 3E, a distance between the separated portions of the semiconductor substrate 102 (with a portion of the film 104 attached to each of the portions of the semiconductor substrate 102) may be increased. In a case of the layer 106 being elastic, the layer 106 may for example be expanded, e.g. in directions indicated by an arrow 446, for increasing the distance between the separated portions of the semiconductor substrate 102. In various embodiments, for example in a case of the semiconductor substrate 102 being separated in two, e.g. orthogonal, directions, an expanding of the layer 106 may further be carried out in directions orthogonal (within a plane of the layer 106) to the directions indicated by the arrow 446. For expanding the layer 106, the layer 106 may be fixed in a holding device 440B, 440T, 442. For example, the layer 106 may be clamped in the holding device 440B, 440T, 442 as shown in FIG. 4A (which may show the layer 106 and the separated semiconductor device 102 with the separated film 104 arranged on it in a fixed, but unexpanded configuration). By moving an expander element 443 as shown in FIG. 3E in a direction 444, e.g. pressing against the layer 106 and moving the layer 106 orthogonal to its lateral direction while keeping a rim of the layer 106 fixed in the holding device 440B, 440T, 442, the layer 106 may be expanded, e.g. in the directions 446. The expanding of the layer 106 may be carried out as known in the art. Alternatively, the expanding may be omitted.

Figure 4D:
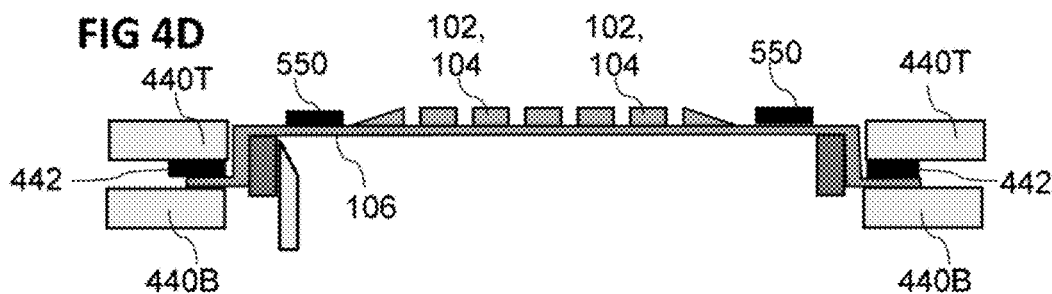
Figure 4E:
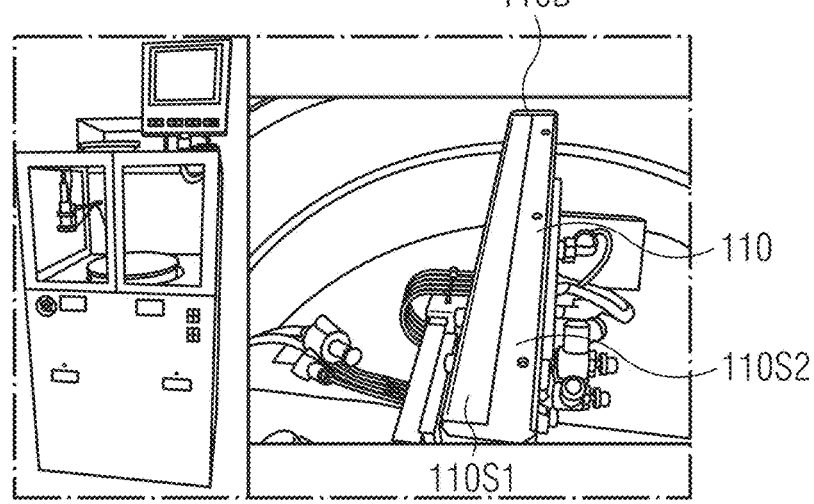

As shown in FIG. 4D, after the expanding, the layer 106 (with the semiconductor substrate 102 with the film 104 arranged on it) may be mounted on a frame 550. Alternatively, the frame 550 may be mounted on the layer 106, e.g. as shown in FIG. 4D. Thereby, a re-contraction of the layer 106 may be prevented, and the individual portions of the semiconductor substrate 102, e.g. the individual chips (dies), may be held in the position with the enlarged distance between them.

Regarding the breaking device 110 and the separating- and expanding processes described above, various parameters may be adjusted. For example an expansion speed, in other words, a speed with which the layer 106 may be expanded, and/or an expansion amount, in other words a factor by which the layer 106 may be expanded, may be adjusted; the expansion of the layer 106 may be carried out after the breaking device 110 may have been removed, or alternatively while the breaking device 110 may still be in contact with the semiconductor substrate 102 (or the film 104, respectively). Furthermore a speed of the breaking device 110, e.g. of a breaking bar, in other words a velocity with which the breaking device 110 may be moved may be adjusted. The direction(s) 112 in which the breaking device 110 may be moved may be adjusted, e.g. adjusted to requirements that may be set by the plurality of separation regions 108 of the semiconductor substrate 102. For example, the breaking device 110 may be moved in one, two or three directions, e.g. 0°, 90° and/or 45°, and a in a case of more than one direction being scanned, a sequence of the directions may be selected, e.g. first scanning along the 0°-direction, thereafter in the 45° direction, or first in the 90° direction, then at 0°, etc. The breaking device 110, e.g. the breaking bar, may be used in connection with the vacuum force described above. Alternatively, the breaking device 110, e.g. the breaking bar, may be used without the vacuum force. Instead, the semiconductor substrate 102 may be forced differently to bend over the breaking edge 110B, for example by applying a mechanical force. Furthermore, frame mounting parameters, e.g. the diameter of the frame 550, may be adjusted.

Figure 5:
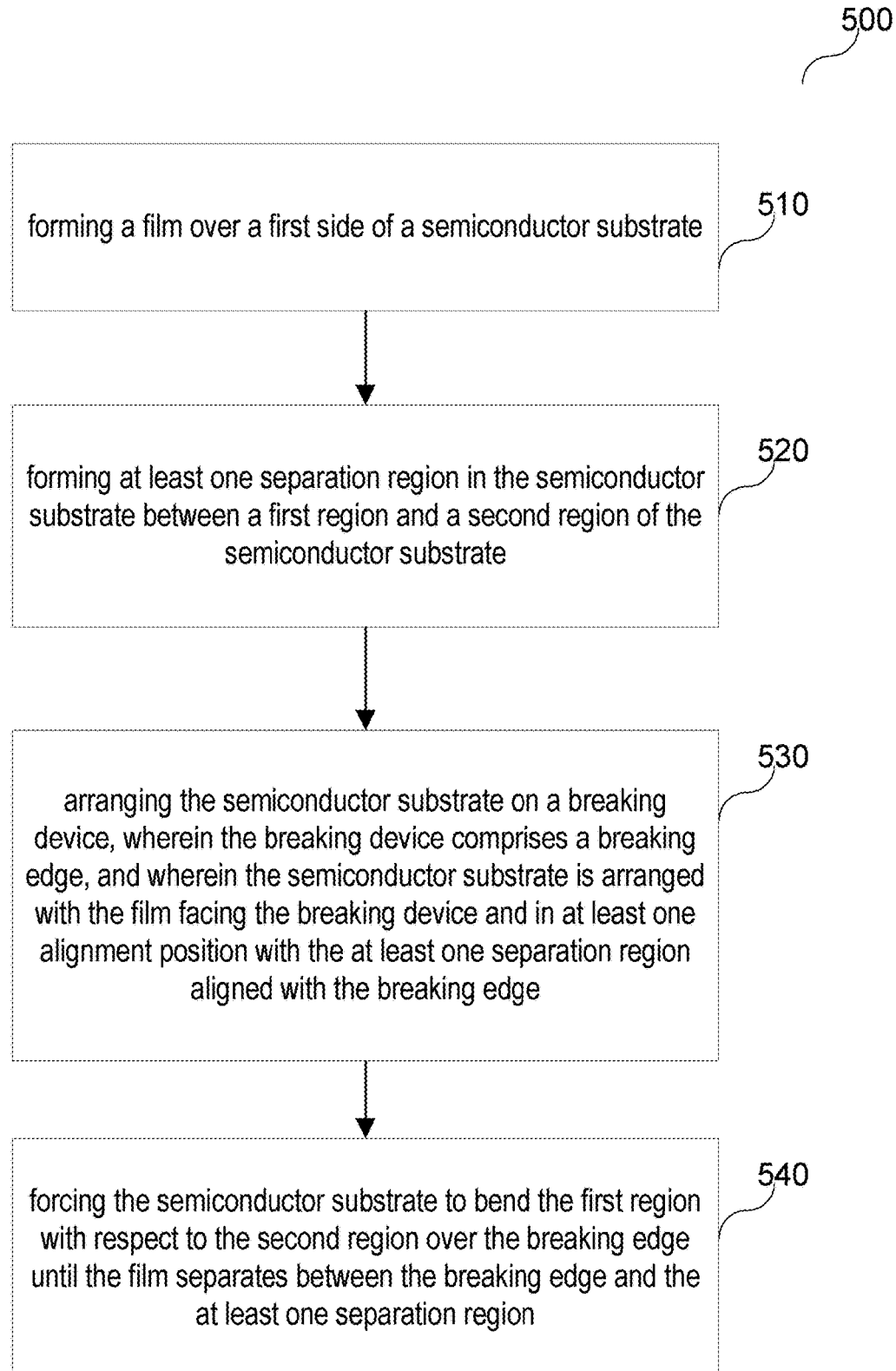
FIG. 5 shows a schematic diagram of a method of processing a semiconductor substrate in accordance with various embodiments.

FIG. 5 shows a schematic diagram of a method 500 of processing a semiconductor substrate in accordance with various embodiments.

In various embodiments, the method may include forming a film over a first side of a semiconductor substrate (in 510). The method may further include forming at least one separation region in the semiconductor substrate between a first region and a second region of the semiconductor substrate (in 520), arranging the semiconductor substrate on a breaking device, wherein the breaking device comprises a breaking edge, and wherein the semiconductor substrate is arranged with the film facing the breaking device and in at least one alignment position with the at least one separation region aligned with the breaking edge (in 530), and forcing the semiconductor substrate to bend the first region with respect to the second region over the breaking edge until the film separates between the breaking edge and the at least one separation region (in 540).

Figure 6:
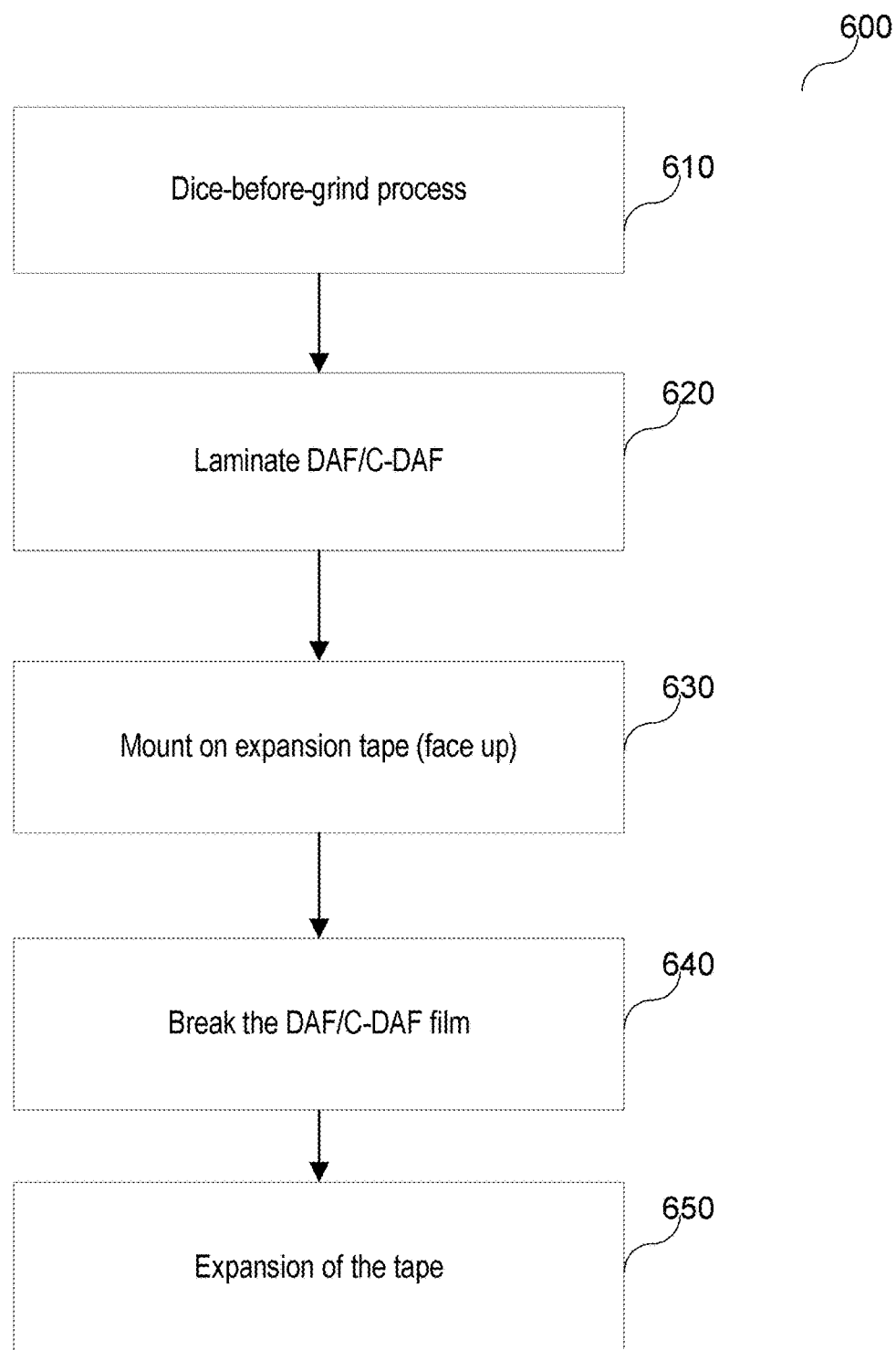
FIG. 6 shows a schematic diagram of a method of processing a semiconductor substrate in accordance with various embodiments.

FIG. 6 shows a schematic diagram 600 of a method of processing a semiconductor substrate in accordance with various embodiments.

The method may include a so-called dice-before-grind process (in 610), which may be carried out on a semiconductor substrate, e.g. as shown in FIG. 3A. The method may further include laminating a film over the semiconductor substrate, e.g. a die attach film, e.g. a conductive die attach film (in 620), e.g. as shown in FIG. 3B, mounting the semiconductor substrate on an expansion tape, wherein the semiconductor substrate may be mounted on the film with the film facing the expansion tape (which may be referred to as a face-up orientation) (in 630), e.g. as shown in FIG. 3C. The method may further include breaking the die attach film, for example as described above, e.g. in context with FIG. 3D, e.g. using a breaking device (in 640). The method may further include expanding the expansion tape (in 650), e.g. as shown in FIG. 3E, thereby increasing a distance between individual portions of the separated semiconductor substrate (with the die attach film attached to each of the individual portions).

Figure 7:
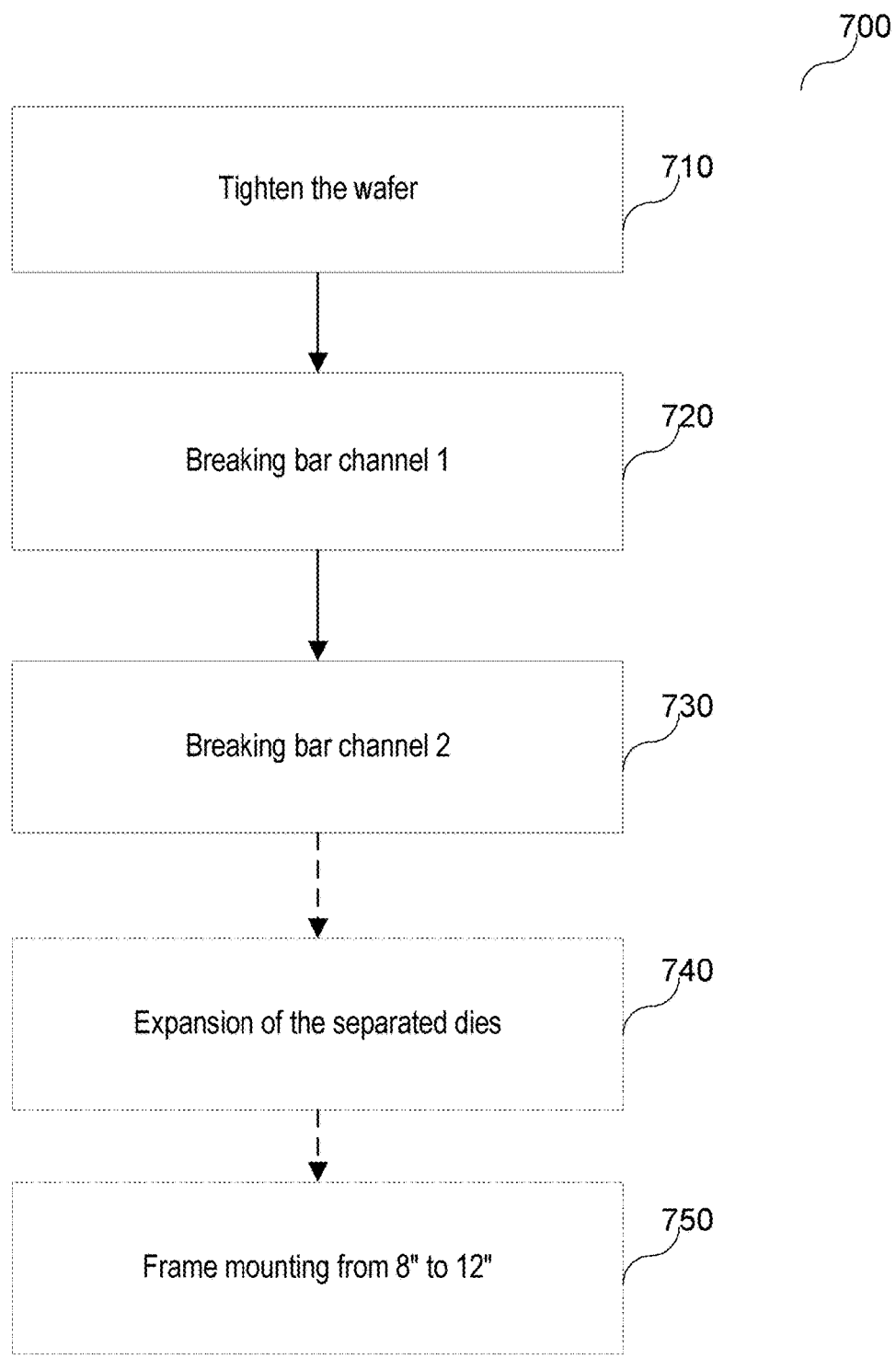
FIG. 7 shows a schematic diagram of aspects of a method of processing a semiconductor substrate in accordance with various embodiments.

FIG. 7 shows a schematic diagram 700 of aspects of a method of processing a semiconductor substrate in accordance with various embodiments.

The method may include tightening a wafer (in 710), e.g. tightening the wafer to a holding device, e.g. fixing the wafer to a holding device, e.g. as shown in FIG. 4A. The method may further include moving a breaking device, e.g. a breaking bar, relative to the wafer in a first direction, also referred to as channel 1 (in 720), e.g. as shown in FIG. 4B. The method may further include moving the breaking device, e.g. the breaking bar, relative to the wafer in a second direction, also referred to as channel 2 (in 730), e.g. as shown in FIG. 4C. Thereby, the wafer may be separated into dies. The method may optionally include expanding the separated dies, in other words, increasing a distance between the separated dies (in 740), e.g. as shown in FIG. 3E. The method may optionally include mounting a frame, e.g. a frame in a diameter from about 8" to about 12" (in 750), e.g. as shown in FIG. 4D.

Figure 8:
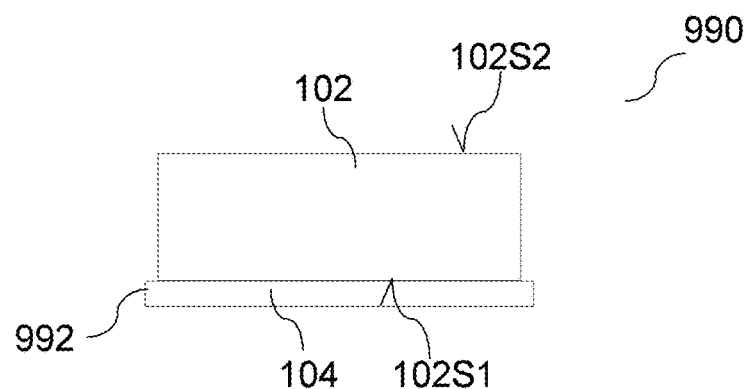
FIG. 8 shows a cross-sectional view of a semiconductor chip according to various embodiments.

FIG. 8 shows a cross-sectional view of a semiconductor chip 990 according to various embodiments.

In various embodiments, a semiconductor chip 990 may be provided. The semiconductor chip 990 may be formed using any of the methods of processing a semiconductor substrate described above, and methods, parameters, materials, etc. described there may apply to the semiconductor chip 990.

In various embodiments, the semiconductor chip 990 may include a film 104 formed over one surface of a semiconductor substrate 102, wherein a side surface 992 of the film 104 may be formed by breaking the film 104.

The surface may be a first surface 102S1 of the semiconductor substrate 102. The semiconductor substrate 102 may include a second surface 102S2 opposite the first surface 102S1. The semiconductor chip 990 may include at least one active region extending from the second surface 102S2 into the semiconductor substrate 102.

In various embodiments, the film 104 may be a die attach film.

In various embodiments, a method of processing a semiconductor substrate may be provided. The method may include forming a film over a first side of a semiconductor substrate, forming at least one separation region in the semiconductor substrate between a first region and a second region of the semiconductor substrate, arranging the semiconductor substrate on a breaking device—The breaking device includes a breaking edge, and wherein the semiconductor substrate is arranged with the film facing the breaking device and in at least one alignment position with the at least one separation region aligned with the breaking edge, and forcing the semiconductor substrate to bend the first region with respect to the second region over the breaking edge until the film separates between the breaking edge and the at least one separation region.

In various embodiments, the film may be rigid at least during the forcing the semiconductor substrate to bend the first region with respect to the second region over the breaking edge until the film separates between the breaking edge and the at least one separation region. The film may be a die attach film. The forcing the semiconductor substrate to bend the first region with respect to the second region may include applying a vacuum suction force to the semiconductor substrate. The breaking device may further include a first surface and a second surface joined at the breaking edge, and the vacuum suction force may be provided at the breaking edge to suck the first region towards the first surface and the second region towards the second surface. The first surface may be recessed from a plane of the second surface. The semiconductor substrate may be a wafer.

The arranging the semiconductor substrate on the breaking device in the at least one alignment position may include placing the semiconductor substrate on the breaking device and moving the semiconductor substrate and the breaking device relative to each other to the at least one alignment position. The moving the semiconductor substrate and the breaking device relative to each other may include moving the breaking device relative to the semiconductor substrate in at least one lateral direction. The moving the breaking device relative to the semiconductor substrate in at least one lateral direction may include moving the breaking device relative to the semiconductor substrate in a first lateral direction, and then moving the breaking device relative to the semiconductor substrate in a second lateral direction. The first lateral direction may be essentially orthogonal to the second lateral direction.

The at least one separation region may include a plurality of separation regions. The plurality of separation regions may include a first plurality of essentially parallel separation regions. The plurality of separation regions may include a second plurality of essentially parallel separation regions, and the second plurality of essentially parallel separation regions may be essentially orthogonal to the first plurality of essentially parallel separation regions. The moving the breaking device relative to the semiconductor substrate in at least one lateral direction may sequentially align each separation region of the plurality of separation regions with the breaking edge.

The forming the at least one separation region in the semiconductor substrate may include forming at least one trench in the semiconductor substrate. The forming the at least one separation region in the semiconductor substrate may include weakening the semiconductor substrate in the at least one separation region. During the forcing the semiconductor substrate to bend the first region with respect to the second region over the breaking edge until the film separates between the breaking edge and the at least one separation region, the semiconductor substrate may separate at the at least one separation region.

In various embodiments, a semiconductor chip may be provided. The semiconductor chip may include a film formed over one surface of a semiconductor substrate, wherein a side surface of the film may be formed by breaking the film.

In various embodiments, the film may be a die attach film.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a semiconductor substrate, the method comprising:
    forming a film over a first side of a semiconductor substrate, wherein the film is a die attach film;
    forming a layer over the film;
    forming at least one separation region in the semiconductor substrate between a first region and a second region of the semiconductor substrate;
    arranging the semiconductor substrate on a breaking device, wherein the breaking device comprises a breaking edge, and wherein the semiconductor substrate is arranged with the film facing the breaking device and in at least one alignment position with the at least one separation region aligned with the breaking edge; and
    forcing the semiconductor substrate to bend the first region with respect to the second region over the breaking edge until the film separates between the breaking edge and the at least one separation region, wherein the layer is configured to remain intact between the breaking edge and the at least one separation region when forcing the semiconductor substrate to bend the first region with respect to the second region over the breaking edge until the film separates.

2. The method of claim 1,
wherein the film is rigid at least during the forcing the semiconductor substrate to bend the first region with respect to the second region over the breaking edge until the film separates between the breaking edge and the at least one separation region.

3. The method of claim 1,
wherein the semiconductor substrate is a wafer.

4. The method of claim 1,
wherein the at least one separation region comprises a plurality of separation regions.

5. The method of claim 4,
wherein the plurality of separation regions comprises a first plurality of essentially parallel separation regions.

6. The method of claim 5,
wherein the plurality of separation regions comprises a second plurality of essentially parallel separation regions, and wherein the second plurality of essentially parallel separation regions is essentially orthogonal to the first plurality of essentially parallel separation regions.

7. The method of claim 4,
wherein the arranging the semiconductor substrate on the breaking device in the at least one alignment position comprises placing the semiconductor substrate on the breaking device and moving the semiconductor substrate and the breaking device relative to each other to the at least one alignment position; and
wherein the moving the breaking device relative to the semiconductor substrate in at least one lateral direction sequentially aligns each separation region of the plurality of separation regions with the breaking edge.

8. The method of claim 1,
wherein the forming the at least one separation region in the semiconductor substrate comprises forming at least one trench in the semiconductor substrate.

9. The method of claim 1,
wherein the forming the at least one separation region in the semiconductor substrate comprises weakening the semiconductor substrate in the at least one separation region.

10. The method of claim 9,
wherein, during the forcing the semiconductor substrate to bend the first region with respect to the second region over the breaking edge until the film separates between the breaking edge and the at least one separation region, the semiconductor substrate separates at the at least one separation region.

11. The method of claim 1,
wherein the breaking device further comprises a first surface and a second surface joined at the breaking edge, and the first surface and the second surface are fixed in position.

12. The method of claim 11,
wherein the first surface is recessed from a plane of the second surface.

13. The method of claim 1,
wherein the forcing the semiconductor substrate to bend the first region with respect to the second region comprises applying a first vacuum suction force and a second vacuum suction force to the semiconductor substrate, wherein the first vacuum suction force is fixed in a first direction and the second vacuum suction force is fixed in a second direction that is different from the first direction.

14. The method of claim 13,
wherein the breaking device comprises a first channel configured to apply the first vacuum suction force and a second channel configured to apply the second vacuum suction force.

15. A method of processing a semiconductor substrate, the method comprising:
forming a film over a first side of a semiconductor substrate;
forming at least one separation region in the semiconductor substrate between a first region and a second region of the semiconductor substrate;
arranging the semiconductor substrate on a breaking device, wherein the breaking device comprises a breaking edge, and wherein the semiconductor substrate is arranged with the film facing the breaking device and in at least one alignment position with the at least one separation region aligned with the breaking edge; and
forcing the semiconductor substrate to bend the first region with respect to the second region over the breaking edge until the film separates between the breaking edge and the at least one separation region;
wherein the forcing the semiconductor substrate to bend the first region with respect to the second region comprises applying a vacuum suction force to the semiconductor substrate;
wherein the breaking device further comprises a first surface and a second surface joined at the breaking edge, and
wherein the vacuum suction force is provided at the breaking edge to suck the first region towards the first surface and the second region towards the second surface.

16. The method of claim 15,
wherein the first surface is recessed from a plane of the second surface.

17. The method of claim 15, wherein the first surface and the second surface are fixed in position.

18. The method of claim 15, further comprising:
reducing the vacuum suction force when the at least one separation region is not aligned with the breaking edge.

19. A method of processing a semiconductor substrate, the method comprising:
forming a film over a first side of a semiconductor substrate;
forming at least one separation region in the semiconductor substrate between a first region and a second region of the semiconductor substrate;
arranging the semiconductor substrate on a breaking device, wherein the breaking device comprises a breaking edge, and wherein the semiconductor substrate is arranged with the film facing the breaking device and in at least one alignment position with the at least one separation region aligned with the breaking edge; and
forcing the semiconductor substrate to bend the first region with respect to the second region over the breaking edge until the film separates between the breaking edge and the at least one separation region;
wherein the arranging the semiconductor substrate on the breaking device in the at least one alignment position comprises placing the semiconductor substrate on the breaking device and moving the semiconductor substrate and the breaking device relative to each other to the at least one alignment position;
wherein the moving the semiconductor substrate and the breaking device relative to each other comprises moving the breaking device relative to the semiconductor substrate in at least one lateral direction; and wherein the moving the breaking device relative to the semiconductor substrate in at least one lateral direction comprises:
   moving the breaking device relative to the semiconductor substrate along a first path in a first lateral direction; and
   then moving the breaking device relative to the semiconductor substrate along a second path in a second lateral direction,
   wherein the first path is different from the second path.

20. The method of claim 19,
   wherein the first lateral direction is essentially orthogonal to the second lateral direction.

\* \* \* \* \*